(12) United States Patent
Root et al.

(10) Patent No.: US 7,728,609 B2
(45) Date of Patent: Jun. 1, 2010

(54) REPLACEABLE PROBE APPARATUS FOR PROBING SEMICONDUCTOR WAFER

(75) Inventors: Bryan J. Root, Apple Valley, MN (US); William A. Funk, Eagan, MN (US)

(73) Assignee: Celadon Systems, Inc., Apple Valley, MN (US)

( * ) Notice: Subject to any disclaimer, the term of this patent is extended or adjusted under 35 U.S.C. 154(b) by 7 days.

(21) Appl. No.: 12/126,677

(22) Filed: May 23, 2008

(65) Prior Publication Data
US 2009/0096472 A1  Apr. 16, 2009

Related U.S. Application Data

(60) Provisional application No. 60/940,242, filed on May 25, 2007.

(51) Int. Cl.
*G01R 31/02* (2006.01)
*G01R 31/26* (2006.01)
(52) U.S. Cl. .................. 324/754; 324/758; 324/761
(58) Field of Classification Search .......... 324/754–765
See application file for complete search history.

(56) References Cited

U.S. PATENT DOCUMENTS

| 2,589,368 A | 3/1952 | Graham et al. |
|---|---|---|
| 3,560,907 A | 2/1971 | Heller |
| 3,597,528 A | 8/1971 | Penfield et al. |
| 3,787,768 A | 1/1974 | Kubota et al. |
| 3,963,986 A | 6/1976 | Morton et al. |
| 4,001,685 A | 1/1977 | Roch |
| 4,365,109 A | 12/1982 | O'Laughlin |
| 4,480,223 A | 10/1984 | Aigo |
| 4,491,686 A | 1/1985 | Caviar |
| 4,626,775 A | 12/1986 | Cho et al. |
| 4,667,523 A | 5/1987 | Becker et al. |
| 4,731,577 A | 3/1988 | Logan |
| 4,768,973 A | 9/1988 | Bakermans |
| 4,814,028 A | 3/1989 | Sawaki et al. |
| 4,845,426 A | 7/1989 | Nolan et al. |
| 4,849,689 A | 7/1989 | Gleason et al. |
| 5,003,254 A | 3/1991 | Hunt et al. |

(Continued)

FOREIGN PATENT DOCUMENTS

EP   0177809   4/1986

(Continued)

*Primary Examiner*—Ha Tran T Nguyen
*Assistant Examiner*—Emily Y Chan
(74) *Attorney, Agent, or Firm*—Hamre, Schumann, Mueller & Larson, P.C.

(57) ABSTRACT

A probe apparatus is provided with a plurality of probe tiles, an interchangeable plate for receiving the probe tiles, a floating plate being disposed between the respective probe tile and a receiving hole on the interchangeable plate, and a control mechanism providing multi-dimensional freedom of motions to control a position of the probe tile relative to the respective receiving hole of the interchangeable plate. A method of controlling the floating plate is also provided by inserting a pair of joysticks into two respective adjustment holes disposed on the floating plate and moving the pair of joysticks to provide translational motions (X-Y) and rotational (theta) motion of the floating plate, and turning the pair of jack screws clockwise and counter-clockwise to provide a translational motion (Z) and two rotational (pitch and roll) motions of the floating plate.

6 Claims, 11 Drawing Sheets

U.S. PATENT DOCUMENTS

| | | | |
|---|---|---|---|
| 5,015,947 | A | 5/1991 | Chism |
| 5,148,103 | A | 9/1992 | Pasiecznik, Jr. |
| 5,150,040 | A | 9/1992 | Byrnes et al. |
| 5,151,653 | A | 9/1992 | Yutori et al. |
| 5,168,218 | A | 12/1992 | Rich |
| 5,192,907 | A | 3/1993 | Bonaria |
| 5,196,789 | A | 3/1993 | Golden et al. |
| 5,214,243 | A | 5/1993 | Johnson |
| 5,325,052 | A | 6/1994 | Yamashita |
| 5,345,170 | A | 9/1994 | Schwindt et al. |
| 5,397,996 | A | 3/1995 | Keezer |
| 5,431,758 | A | 7/1995 | Dellale |
| 5,449,017 | A | 9/1995 | Collins et al. |
| 5,473,254 | A | 12/1995 | Asar |
| 5,477,160 | A | 12/1995 | Love |
| 5,486,770 | A | 1/1996 | Johnson |
| 5,488,292 | A | 1/1996 | Tsuta |
| 5,517,126 | A | 5/1996 | Yamaguchi |
| 5,525,911 | A | 6/1996 | Marumo et al. |
| 5,729,150 | A | 3/1998 | Schwindt |
| 5,742,174 | A | 4/1998 | Kister et al. |
| 5,821,764 | A | 10/1998 | Slocum et al. |
| 5,952,843 | A | 9/1999 | Vinh |
| 6,014,032 | A | 1/2000 | Maddix et al. |
| 6,020,750 | A | 2/2000 | Berger et al. |
| 6,037,785 | A | 3/2000 | Higgins |
| 6,050,829 | A | 4/2000 | Eldridge et al. |
| 6,075,376 | A | 6/2000 | Schwindt |
| 6,124,723 | A | 9/2000 | Costello |
| 6,137,302 | A | 10/2000 | Schwindt |
| 6,201,402 | B1 | 3/2001 | Root |
| 6,275,051 | B1 | 8/2001 | Bachelder et al. |
| 6,276,956 | B1 | 8/2001 | Cook |
| 6,377,062 | B1 | 4/2002 | Ramos et al. |
| 6,420,888 | B1 | 7/2002 | Griffin et al. |
| 6,429,673 | B1 | 8/2002 | Obata et al. |
| 6,586,954 | B2 * | 7/2003 | Root .................. 324/754 |
| 6,603,322 | B1 | 8/2003 | Boll et al. |
| 6,608,496 | B1 | 8/2003 | Strid et al. |
| 6,690,185 | B1 | 2/2004 | Khandros et al. |
| 6,696,849 | B2 | 2/2004 | Ban et al. |
| 6,710,608 | B2 | 3/2004 | Yoshida et al. |
| 6,727,726 | B1 | 4/2004 | Plants |
| 6,744,267 | B2 | 6/2004 | Sauk et al. |
| 6,747,467 | B2 | 6/2004 | Iino |
| 6,798,227 | B1 | 9/2004 | Hwang |
| 6,815,961 | B2 | 11/2004 | Mok et al. |
| 6,847,219 | B1 | 1/2005 | Lesher et al. |
| 6,882,168 | B2 | 4/2005 | Root |
| 6,958,449 | B2 | 10/2005 | Ziebart et al. |
| 6,963,207 | B2 | 11/2005 | Root et al. |
| 6,975,128 | B1 | 12/2005 | Root et al. |
| 7,148,710 | B2 | 12/2006 | Root |
| 7,345,494 | B2 | 3/2008 | Root |
| 2001/0011902 | A1 | 8/2001 | Schwindt |
| 2002/0084794 | A1 | 7/2002 | Root |
| 2004/0000920 | A1 | 1/2004 | Root et al. |
| 2004/0051541 | A1 | 3/2004 | Zhou et al. |
| 2004/0056676 | A1 | 3/2004 | Root |
| 2004/0174175 | A1 | 9/2004 | Root et al. |
| 2005/0206395 | A1 | 9/2005 | Root |
| 2006/0049841 | A1 | 3/2006 | Root et al. |
| 2007/0069747 | A1 | 3/2007 | Root |

FOREIGN PATENT DOCUMENTS

| | | |
|---|---|---|
| JP | 6088906 | 3/1994 |
| WO | WO 99/04273 | 1/1999 |
| WO | WO 2004/081980 | 9/2004 |

* cited by examiner

REPLACEABLE PROBE APPARATUS FOR PROBING SEMICONDUCTOR WAFER

CROSS-REFERENCE TO RELATED APPLICATION

This patent application claims the priority of U.S. Provisional Patent Application Ser. No. 60/940,242, filed on May 25, 2007, and subject matter of which is incorporated herewith by reference.

This patent application is also related to U.S. Utility patent application Ser. No. 09/730,130, filed on Dec. 4, 2000, now issued U.S. Pat. No. 6,586,954; U.S. Utility patent application Ser. No. 10/601,764, filed on Jun. 23, 2003; U.S. Utility patent application Ser. No. 09/021,631, filed on Feb. 10, 1998, now issued U.S. Pat. No. 6,201,402; U.S. Utility patent application Ser. No. 10/607,768, filed on Jun. 27, 2003; U.S. patent application Ser. No. 10/383,079, filed on Mar. 6, 2003; U.S. Utility patent application Ser. No. 10/809,051, filed on Mar. 25, 2004; U.S. Utility patent application Ser. No. 11/216,757, filed on Aug. 31, 2005; subject matter of which are incorporated herewith by references.

FIELD OF THE INVENTION

The present invention relates generally to semiconductor test equipment, and more particularly, to a probe apparatus used in semiconductor test equipment for electrically probing devices on a semiconductor wafer.

BACKGROUND OF THE INVENTION

The semiconductor industry has a need to access many electronic devices on a semiconductor wafer. As the semiconductor industry grows and devices become more complex, many electrical devices, most commonly semiconductor devices, must be electrically tested, for example, for leakage currents and extremely low operating currents. These currents are often below 100 fA. In addition, the currents and device characteristics are often required to be evaluated over a wide temperature range to understand how temperature affects a device, thereby having controllable device characteristics. To effectively measure at currents below 100 fA, a measurement signal must be isolated from external electrical interference, leakage currents through the dielectric material, parasitic capacitance, triboelectric noise, piezoelectric noise, and dielectric absorption, etc.

Additionally, due to the wide variety of die pitches (referring to the spacing between adjacent devices on a die/wafer or the corresponding spacing between adjacent probe tiles on a base plate), users need the flexibility of reusing probe tiles in a variety of base plates. These base plates match different die pitches. Die pitch relates to the size of a die. The size of a die pitch may vary, for example, from 10 mm$^2$ to 30 mm$^2$, etc. Further, the shape of a die pitch may vary as well, for example, a rectangular shape, a square shape, etc.

At present, semiconductor test equipment is designed such that a user has to use different probe tiles (or sometimes referring to as "probe cards") if the size or shape of die pitches on a die/wafer is different.

Thus, it is desirable to have a probe apparatus that allows the flexibility of reusing probe tiles. Further, it is desired that external electrical interference, leakage currents through the dielectric material, parasitic capacitance, triboelectric noise, piezoelectric noise, and dielectric absorption are significantly reduced or eliminated.

SUMMARY OF THE INVENTION

To solve the above and the other problems, the present invention provides a probe apparatus for testing semiconductor devices on a wafer.

In one embodiment of the present invention, the probe apparatus comprises:
- an interchangeable plate having at least one receiving hole;
- at least one probe tile to be placed in the at least one receiving hole;
- at least one floating plate, the at least one floating plate being disposed between the respective probe tile and the receiving hole; and
- a control mechanism providing multiple dimensional freedom of motions to control a position of the probe tile relative to the respective receiving hole of the interchangeable plate.

Still in one embodiment of the present invention, the floating plate includes at least one hold-down slot for receiving a hold-down screw to mount the floating plate onto the interchangeable plate, at least one jack screw, and at least one adjustment hole for receiving a "joystick" type of rod.

Further in one embodiment of the present invention, the multi-dimensional freedom of motions include translational (X-Y) motions and rotational (theta) motion controlled by the "joystick" type of rod, and a translational (Z) motion and pitch and roll motions controlled by the jack screw. In one embodiment, there are two jack screws and two "joystick" type of rods.

Yet in one embodiment of the present invention, the probe tile is a self-contained unit and removable or replaceable from the respective receiving hole. Multiple devices on a wafer placed under the interchangeable plate can be tested independently or simultaneously, and different sets of devices on the wafer can be tested after replacing at least some of the probe tiles.

These and other advantages of the present invention will become apparent to those skilled in the art from the following detailed description, wherein it is shown and described illustrative embodiments of the invention, including best modes contemplated for carrying out the invention. As it will be realized, the invention is capable of modifications in various obvious aspects, all without departing from the spirit and scope of the present invention. Accordingly, the drawings and detailed description are to be regarded as illustrative in nature and not restrictive.

DETAILED DESCRIPTION OF THE PREFERRED EMBODIMENTS

Figure 1:
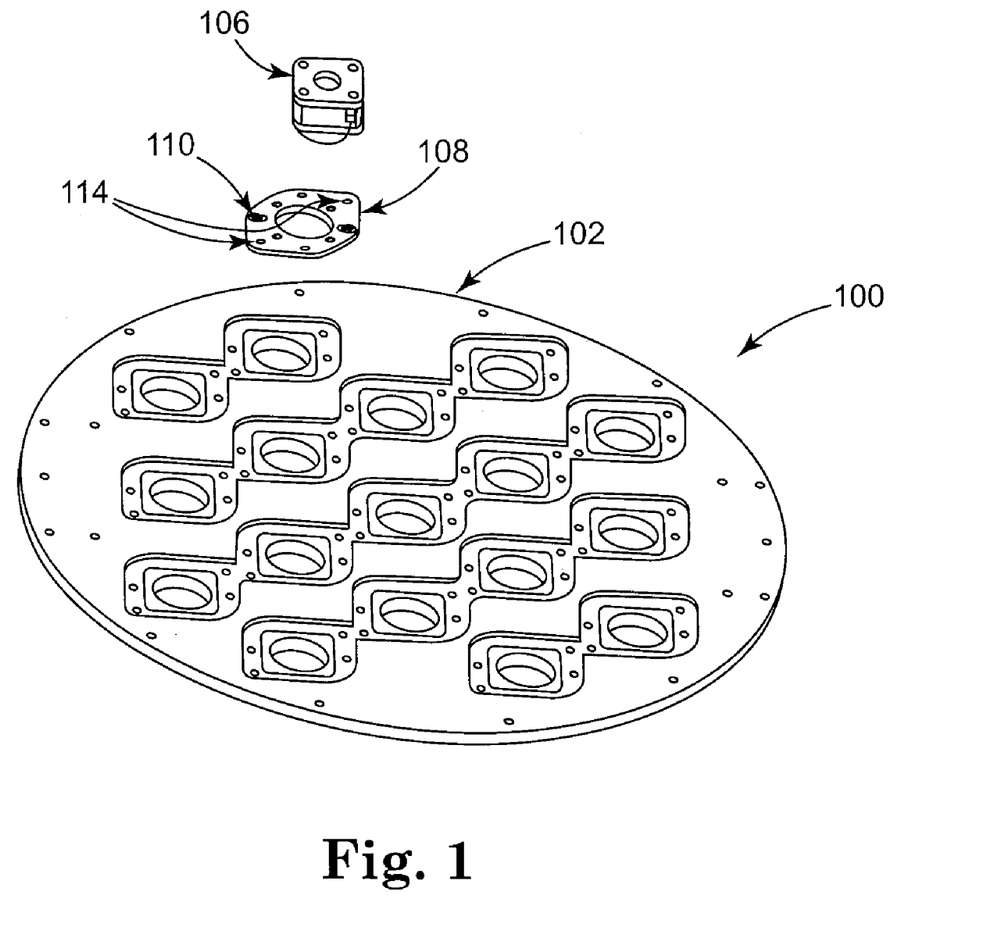
FIG. 1 illustrates an exploded view of one embodiment of a probe apparatus generally in accordance with the principles of the present invention.
Figure 2:
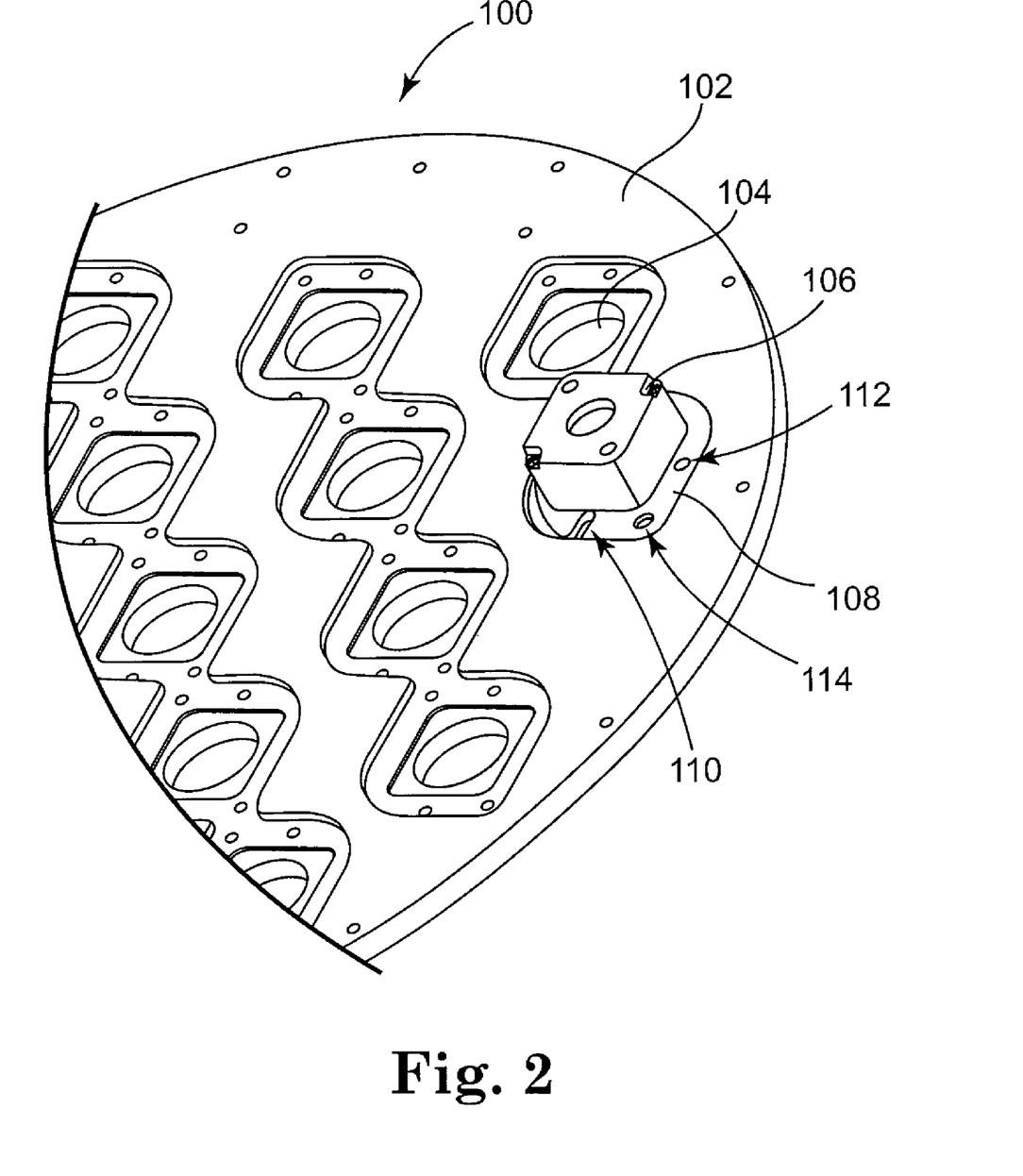
FIG. 2 illustrates a partial, close-up view of one embodiment of a probe apparatus generally in accordance with the principles of the present invention.
Figures 3A, 3B:
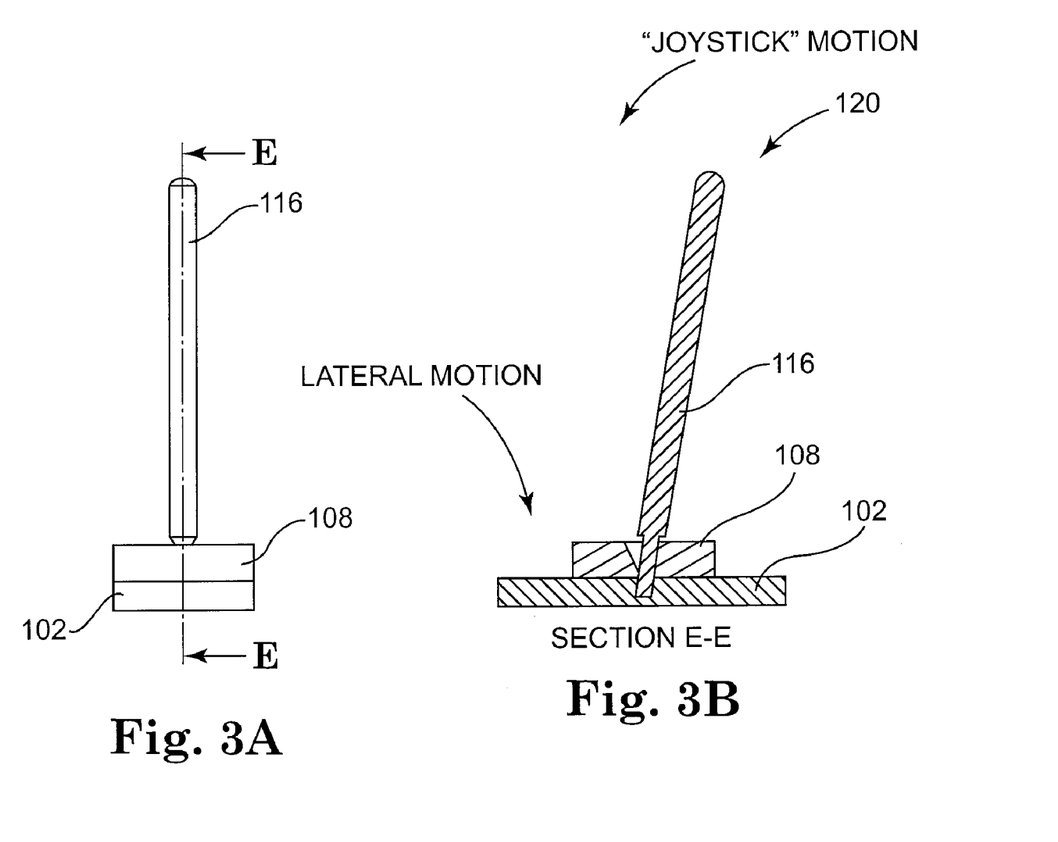
FIGS. 3A and 3B illustrate a side elevation view and a cross-sectional view of a "joystick" motion of a "joystick" type of rod which manipulates and provides multiple dimensional freedom of motions of the probe tile relative to the respective receiving hole of the interchangeable plate generally in accordance with the principles of the present invention.
Figure 4:
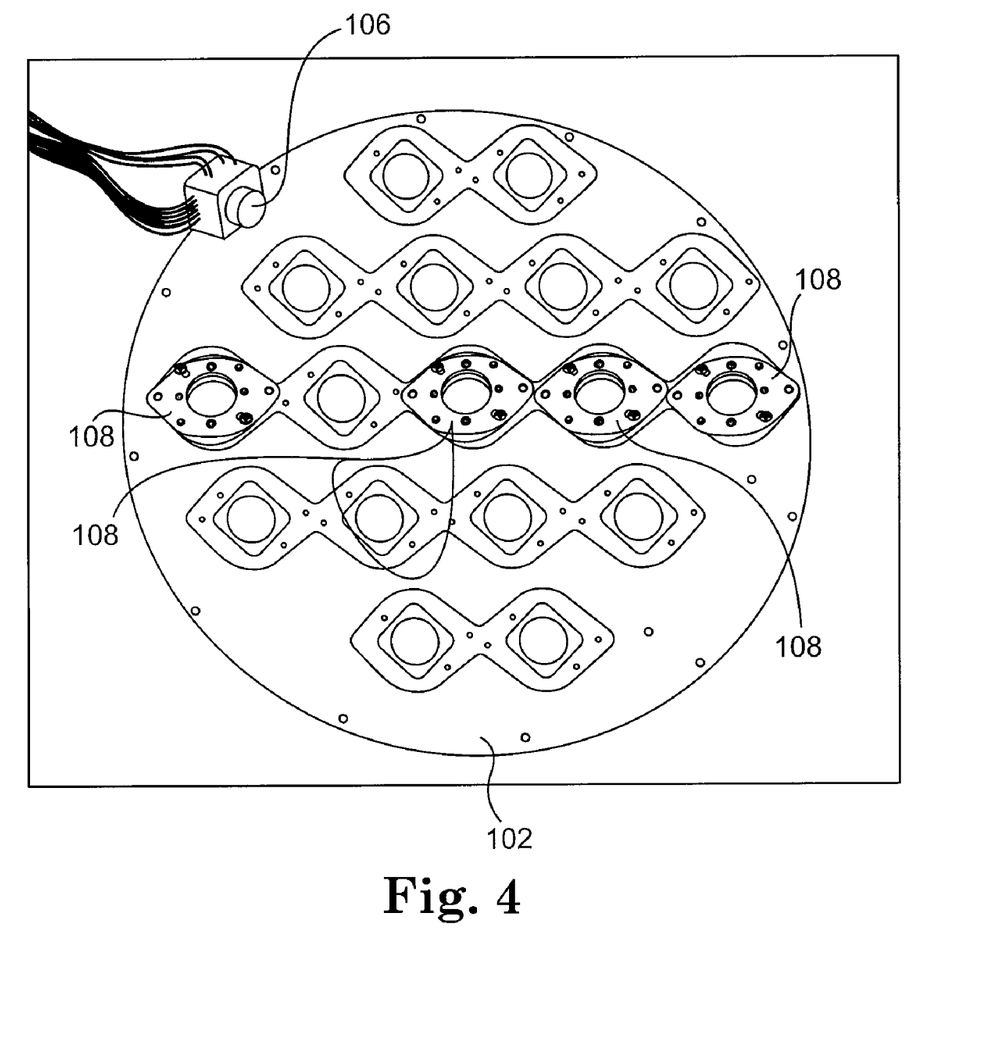
FIG. 4 illustrates one embodiment of an interchangeable plate and a probe tile disassembled from the interchangeable plate of the probe apparatus generally in accordance with the principles of the present invention.

In FIGS. 1-11, a probe apparatus 100 generally in accordance with the principles of the present invention includes an interchangeable plate 102 having a plurality of probe tile receiving holes 104, a plurality of replaceable probe tiles 106 (one is being shown in FIGS. 1-2) to be placed in the receiving holes 104; and a plurality of floating plates 108 (one is being shown in FIGS. 1-2). The floating plate 108 is mounted on the respective receiving hole 104 between the respective probe tile 106 and the receiving hole 104.

As shown in FIGS. 1-9, the floating plate 108 includes at least one retaining slot 110 (or referred to as "hold-down slot") for receiving a hold-down screw 111 to mount the floating plate 108 onto the interchangeable plate 102, a pair of jack screws 112, at least one adjustment hole 114 for receiving a "joystick" type adjustment rod 116. The floating plate 108 is disposed between the respective probe tile 106 and the receiving hole 104.

As shown in FIGS. 3A-3B, 5, and 7-8, a control mechanism 120 provides multiple dimensional freedom of motions to control a position of the probe tile 106 relative to the respective receiving hole 104 of the interchangeable plate 102. To afford full positioning capability of individual probe tiles, the control mechanism 120 controls at least 6 degrees of freedom of movement. In one embodiment, two adjustment rods 116, such as a "joystick" type of rod, are used to provide two translational (X & Y) motions and one rotational (theta) motion, which are not shown but commonly understood by person skilled in the art. When the pair of joysticks 116 are moved in unison, the translations on a probe tile match the direction of the joysticks 116. The theta rotation is accomplished by moving the pair of joysticks 116 in opposite directions.

Figure 5:
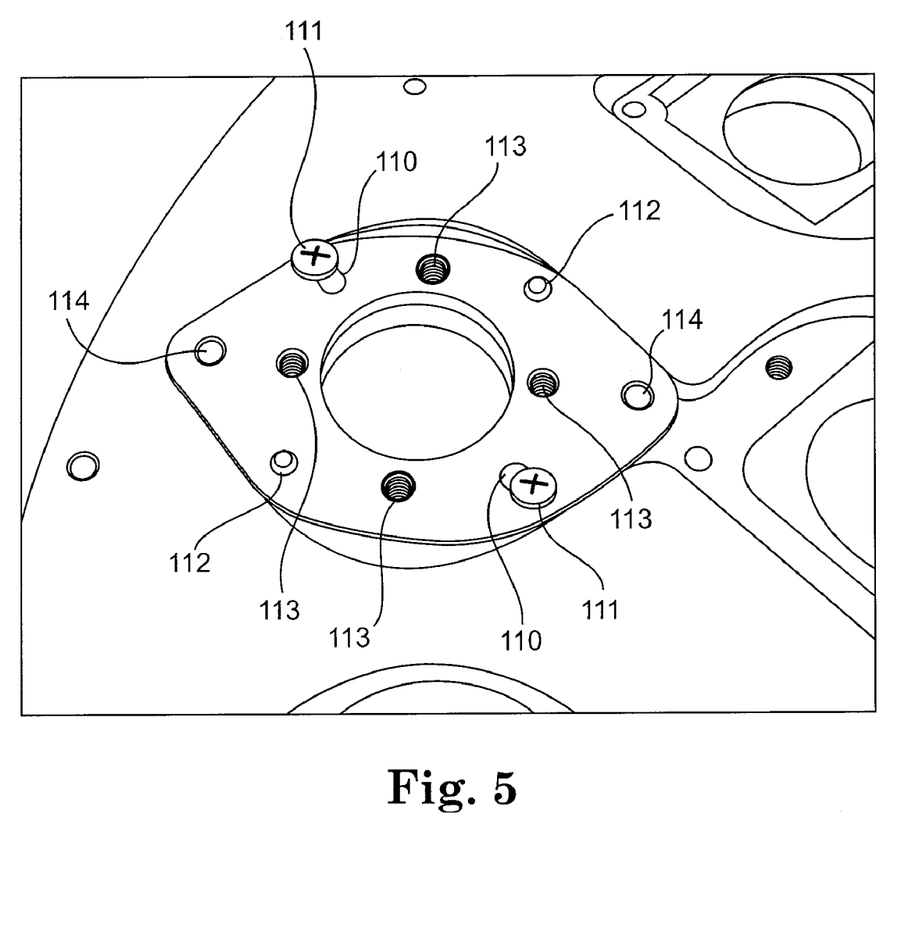
FIG. 5 illustrates one embodiment of the floating plate mounted on one of the receiving holes of the interchangeable plate of the probe apparatus generally in accordance with the principles of the present invention.
Figure 6:
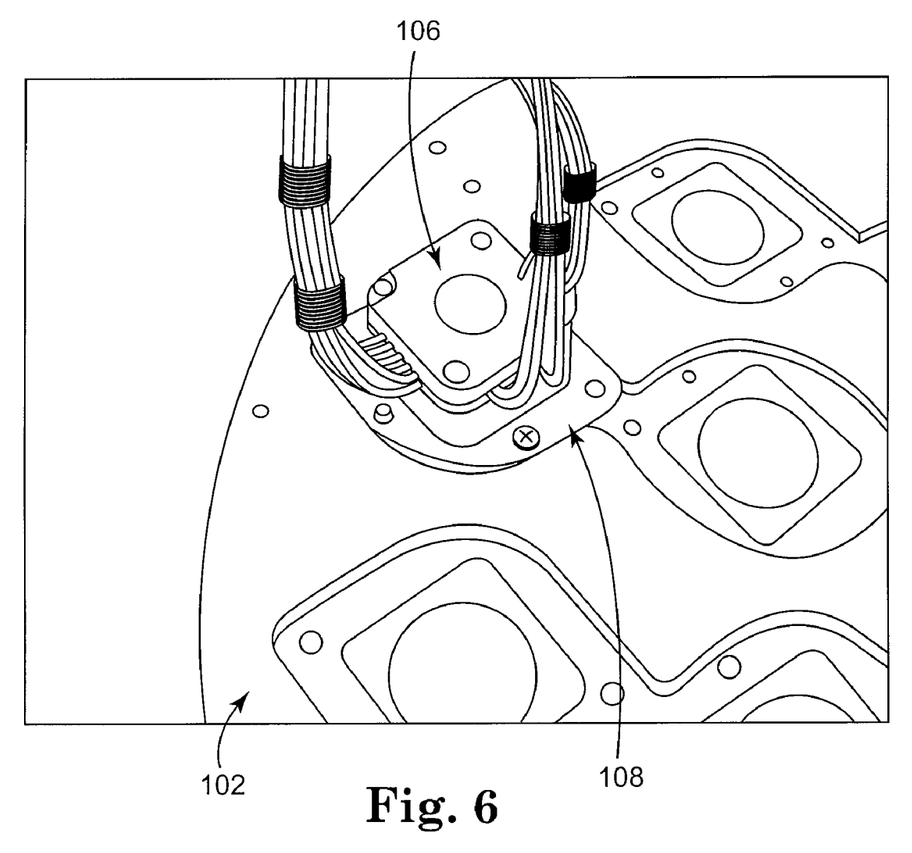
FIG. 6 illustrates one embodiment of a probe tile mounted on the floating plate as shown in FIG. 5.
Figure 7:
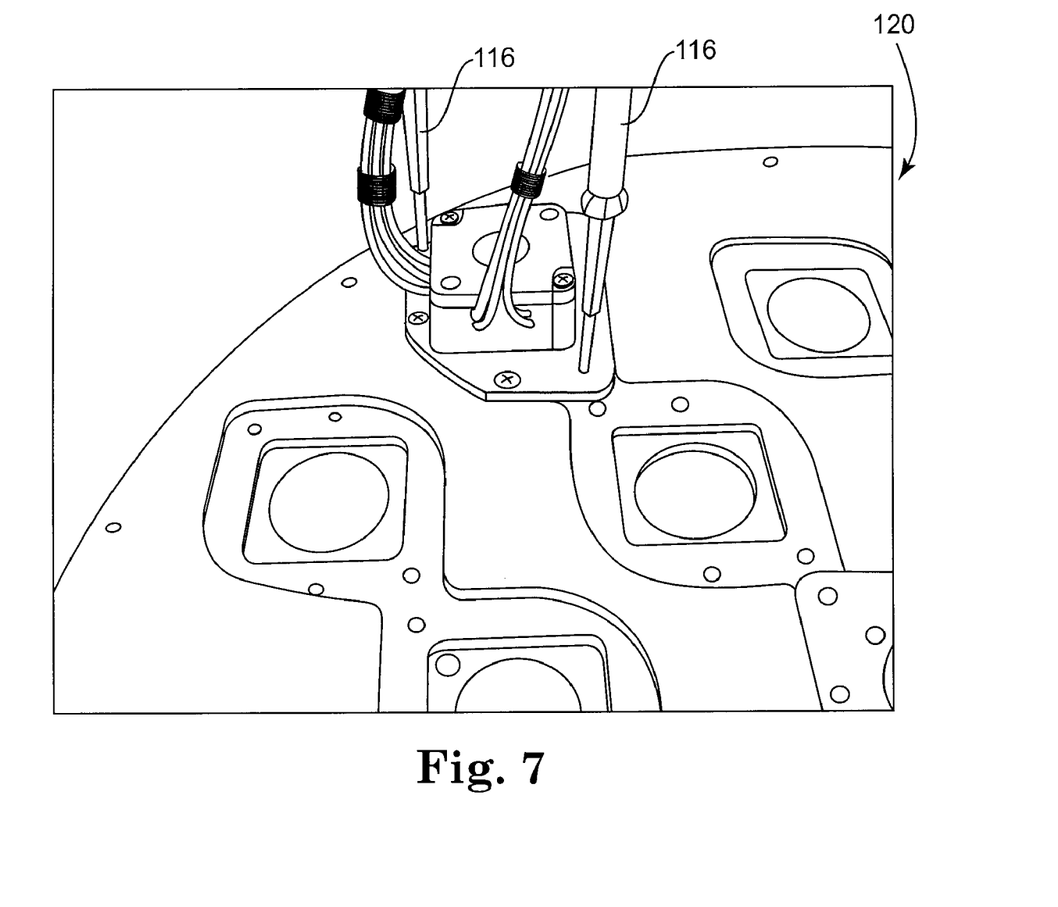
FIGS. 7 and 8 illustrate one embodiment of the probe tile mounted on the floating plate being manipulated by one or two "joystick" type rods generally in accordance with the principles of the present invention.
Figure 8:
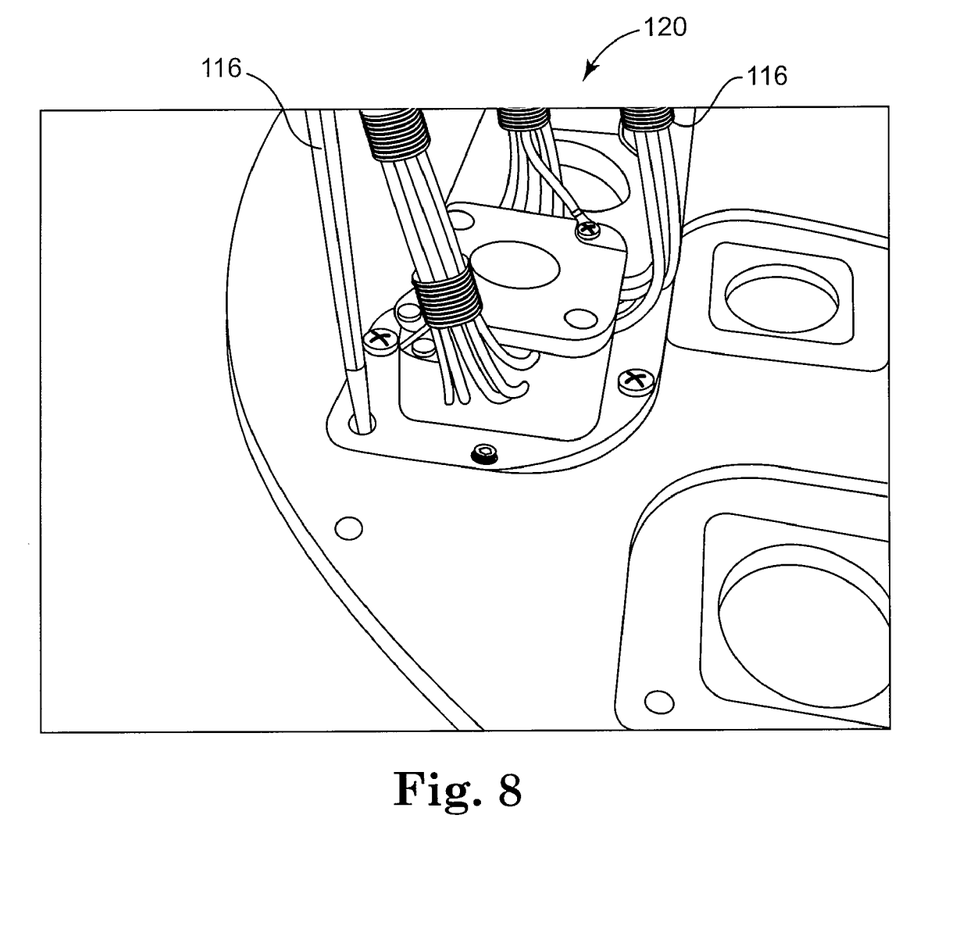
Figure 9:
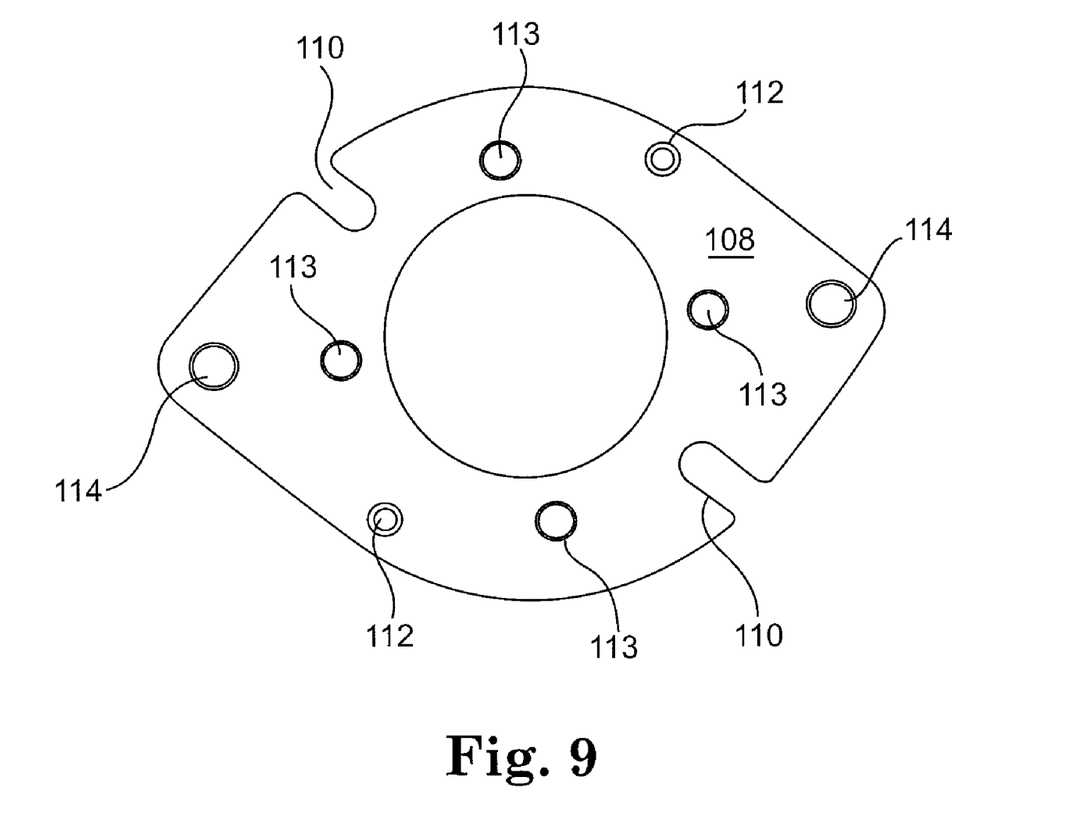
FIG. 9 illustrates one embodiment of the floating plate generally in accordance with the principles of the present invention.
Figure 10:
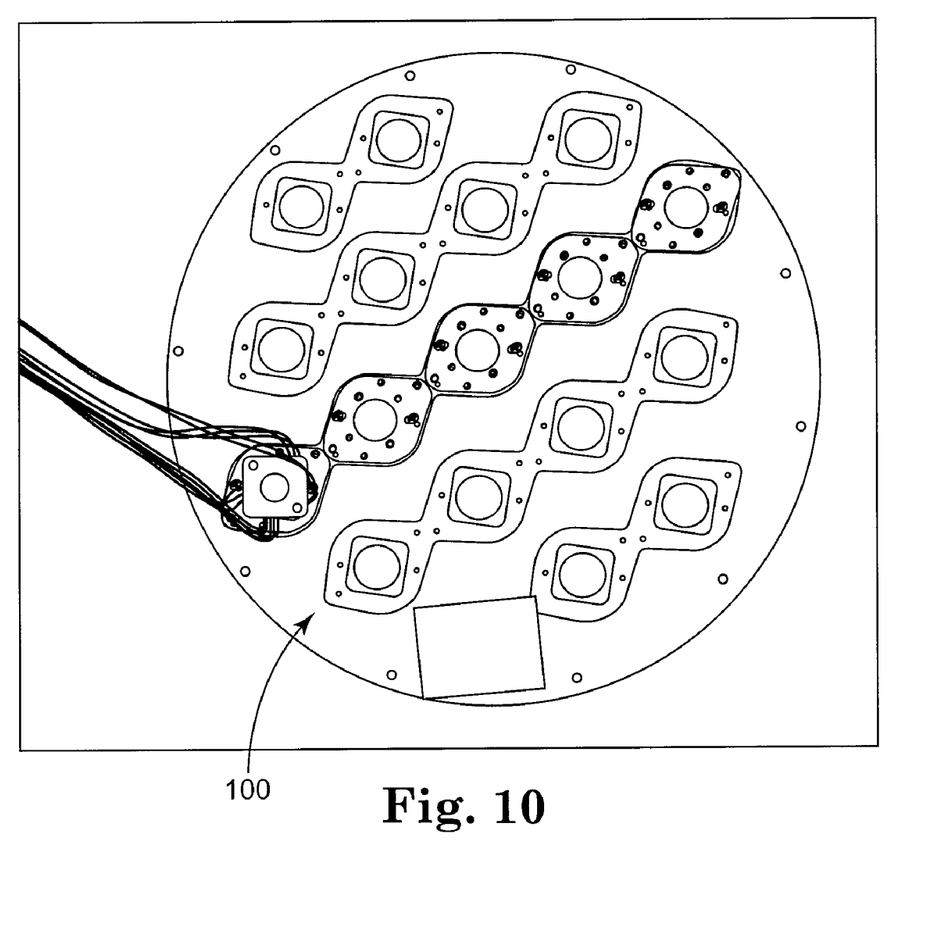
FIG. 10 illustrates a top view of one embodiment of a probe apparatus having a probe tile being mounted on the interchangeable plate in a probe testing environment generally in accordance with the principles of the present invention.
Figure 11:
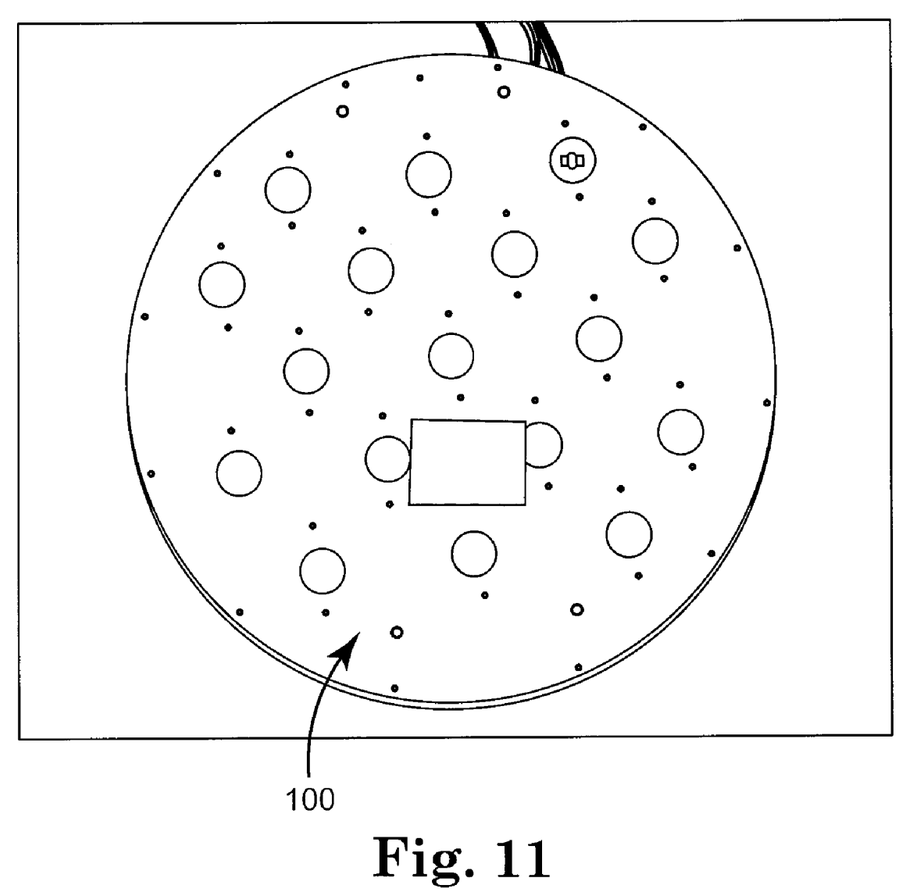
FIG. 11 illustrates a bottom view of one embodiment of a probe apparatus as shown in FIG. 10 generally in accordance with the principles of the present invention.

Further in the embodiment shown in FIG. 5, the pair of jack screws 112 are used to provide the remaining translational (Z) motion and two rotational (pitch and roll) motions. The jack screws 112 are paired on opposing sides of the probe tile 106. In one embodiment, running all the jack screws 112 up (e.g. counter-clockwise) raises the probe tile, whereas running all jack screws 112 down (e.g. clockwise) lowers the probe tile. By running one of a pair of opposing jack screws 112 up and the other down, the probe tile can be tilted, i.e. pitch and roll.

Also, the floating plate 108 may be used as a spring to maintain a preload on the jack screws 112 and provide friction to maintain the probe tile position during a test.

The probe tile 106 is a self-contained unit which is mounted on the floating plate 108 by mounting the probe tile 106 via mounting holes 113 as shown in FIG. 5. The probe tile 106 is removable from the floating plate 108 and can be replaced by another probe tile 106. Multiple devices on a wafer placed under the interchangeable plate 102 can be tested independently or simultaneously. The probe tiles are removable and replaceable, and different sets of devices on the wafer can be tested after removing and replacing some of the probe tiles 106.

Other features and advantages of the present invention may include the following:

1) High mechanical tolerance.
2) Controllable characteristics affected by many factors, such as temperature, limited connections/bond pads and device real estate on a wafer.
3) Flexible testing capability.
4) Interchangeable probe plate, float plates for lateral motion, pitch/roll adjustments between the probe plate and the probe tile.
5) Self-contained probe tile.
6) Features described in the related patent applications mentioned above.
7) Scalability
8) High Testing Precision From the above description and drawings, it will be understood by those of skilled in the art that the particular embodiments shown and described are for purposes of illustration only and are not intended to limit the scope of the present invention. Those of skilled in the art will recognize that the present invention may be embodied in other specific forms without departing from its spirit or essential characteristics. References to details of particular embodiments are not intended to limit the scope of the invention. For example, it is appreciated that in other embodiments, one joystick or more than two joysticks can be provided without departing from the scope of the present invention.

What is claimed is:

1. A probe apparatus, comprising:
   an interchangeable plate having at least one receiving hole;
   at least one probe tile to be placed in the at least one receiving hole;
   at least one floating plate, the at least one floating plate being disposed between the respective probe tile and the receiving hole,
   the floating plate includes at least one hold-down slot for receiving a hold-down screw to mount the floating plate onto the interchangeable plate, at least one jack screw, and at least one adjustment hole for receiving a "joystick" type of rod; and
   the at least one jack screw and the at least one adjustment hole providing a control mechanism that provides multiple dimensional freedom of motions to control a position of the probe tile relative to the respective receiving hole of the interchangeable plate.

2. The probe apparatus of claim 1, wherein the multi-dimensional freedom of motions include translational (X-Y) motions and rotational (theta) motion controlled by the "joystick" type of rod, and a translational (Z) motion and pitch and roll motions controlled by the at least one jack screw.

3. The probe apparatus of claim 1, wherein the probe tile is a self-contained unit and removable or replaceable from the respective receiving hole.

4. A method of controlling a floating plate of a probe apparatus, comprising:
   providing a pair of jack screws mounted on the floating plate;

inserting a pair of joysticks into two respective adjustment holes disposed on the floating plate; and moving the pair of joysticks to provide translational motions (X-Y) and rotational (theta) motion of the floating plate.

5. The method of claim 4, further comprising:

turning the pair of jack screws clockwise and counterclockwise to provide a translational motion (Z) and two rotational (pitch and roll) motions of the floating plate.

6. A probe apparatus, comprising:

an interchangeable plate having at least one receiving hole;

at least one probe tile to be placed in the at least one receiving hole;

at least one floating plate, the at least one floating plate being disposed between the respective probe tile and the receiving hole, the floating plate includes at least one jack screw, and at least one adjustment hole for receiving a "joystick" type of rod; and the at least one jack screw and the at least one adjustment hole providing a control mechanism that provides multiple dimensional freedom of motions to control a position of the probe tile relative to the respective receiving hole of the interchangeable plate.

* * * * *